(12) United States Patent
Yu et al.

(10) Patent No.: US 8,770,997 B2
(45) Date of Patent: Jul. 8, 2014

(54) FOLDABLE USB CONNECTOR

(71) Applicant: Walton Advanced Engineering Inc., Kaohsiung (TW)

(72) Inventors: Hong-Chi Yu, Kaohsiung (TW); Mao-Ting Chang, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 6 days.

(21) Appl. No.: 13/727,748

(22) Filed: Dec. 27, 2012

(65) Prior Publication Data
US 2013/0224976 A1      Aug. 29, 2013

(30) Foreign Application Priority Data

Feb. 29, 2012   (TW) ............................ 101106447 A

(51) Int. Cl.
*H01R 35/02*      (2006.01)
(52) U.S. Cl.
CPC ...................... *H01R 35/02* (2013.01)
USPC ........................................................ 439/164
(58) Field of Classification Search
CPC .... H01R 35/04; H01R 2201/06; H01R 13/73; H01R 35/00; H01R 35/02; H01R 2201/26; H01R 11/00
USPC ................................................... 439/164, 165
See application file for complete search history.

(56) References Cited

U.S. PATENT DOCUMENTS

| | | | | |
|---|---|---|---|---|
| 5,710,421 A * | 1/1998 | Kokubu | ......................... | 235/492 |
| 5,936,227 A * | 8/1999 | Truggelmann et al. | ........ | 235/492 |
| 7,121,852 B2 * | 10/2006 | Ng et al. | ........................ | 439/165 |
| 7,255,582 B1 * | 8/2007 | Liao | ............................... | 439/165 |
| 7,344,072 B2 * | 3/2008 | Gonzalez et al. | .............. | 235/441 |
| 7,375,494 B2 * | 5/2008 | Daniel et al. | ................... | 320/112 |
| 7,377,448 B2 * | 5/2008 | Dan et al. | ....................... | 235/492 |
| 7,447,037 B2 * | 11/2008 | Hiew et al. | ..................... | 361/737 |
| 7,537,169 B2 * | 5/2009 | Gonzalez et al. | .............. | 439/131 |
| 8,047,443 B2 * | 11/2011 | Depaula | ......................... | 235/492 |
| 8,117,745 B2 * | 2/2012 | Wenngren | ........................ | 29/854 |
| 8,488,327 B2 * | 7/2013 | Garnier | .......................... | 361/736 |
| 8,498,105 B2 * | 7/2013 | Yu et al. | .................... | 361/679.32 |
| 2005/0230483 A1 * | 10/2005 | Miller et al. | ................... | 235/492 |
| 2010/0005224 A1 * | 1/2010 | Gupta | ............................ | 711/103 |
| 2010/0328874 A1 * | 12/2010 | Ko | ............................ | 361/679.32 |
| 2012/0026672 A1 * | 2/2012 | Yu et al. | .................... | 361/679.32 |

\* cited by examiner

*Primary Examiner* — Briggitte R Hammond
(74) *Attorney, Agent, or Firm* — Bacon & Thomas, PLLC

(57) ABSTRACT

The present invention provides a foldable USB connector comprising a first folding part, a second folding part and an elastic strap, facilitates effective use, saves more space to match demand for a compact design currently, and is integrated with other relevant products to create a composite product with diversified functions and advantages such as compact structure.

12 Claims, 7 Drawing Sheets

FOLDABLE USB CONNECTOR

BACKGROUND OF THE INVENTION

1) Field of the Invention

The present invention relates to a connector, particularly a foldable USB connector.

2) Description of the Prior Art

The portable data storage devices, particularly flash discs, have been popularized recently with the electronic industry progressively developed. Generally, a flash disc is equipped with a USB connector which can be easily connected to an electronic device's USB port for accessing or storing data. As an internationally agreed specification for connectors, Universal Serial Bus (USB) offer users several advantages such as convenience in accessing data, expandability, and high transmission speed and have been extensively applied to multiple electronic devices, peripheral devices linking a computer, Information Appliances (IA), or 3C (computer, communications and consumer electronics) products.

As shown in FIG. 1, a flash disc (70) based on the prior art is usually provided with: a USB connector (71) welded onto a printed circuit board; an elongated body (72) behind the USB connector (71); electronic components such as flash memory, controller chip, and passive component held in the elongated body (72) and installed on a substrate (printed circuit board).

However, the flash disc (70) based on the prior art and limited to the USB connector (71) as well as the elongated body (72) deserves to be upgraded under demands for a compact electronic product currently.

Furthermore, the USB connector (71) or the elongated body (72) of the flash disc (70) based on the prior art still has bigger volume which is unconformable to demand for a compact device with the flash disc (70) assembled onto other relevant products and diversified functions still kept.

SUMMARY OF THE INVENTION

The present invention is intended for providing a foldable USB connector, which effectively employs or saves space and is in conformity with current demands for design of a compact device and integrated with other relevant devices to create a composite product with multiple functions and a compact structure, as a solution to solve the above problems.

To reach the above purposes, the present invention has the following technical measures as a major method. The present invention is a foldable USB connector comprising a first folding part, a second folding part and an elastic strap: the first folding part coordinates the second folding part to form a connective structure in between for development of an axis by which the first folding part and the second folding part are turned to become unfolded or folded; the first folding part and the second folding part have holding grooves opposite to each other for development of a through slot in which the elastic strap is compactly held; the first folding part and the second folding part on which the elastic strap applies a restoring force are quickly unfolded in accordance with the axis when a user exerts his/her strength on external end planes of the first folding part and the second folding part which have been folded; the first folding part is provided with a plurality of metal contacts on a first external surface; the second folding part is provided with a plurality of metal contacts on a second external surface; the metal contacts are extensively distributed on an end plane of the first folding part and an opposite end plane of the second folding part so that the first folding part and the second folding part which are unfolded and electrically connected become a USB connector.

The purposes and technical issues in the present invention can be further realized by means of the following technical measures.

In the above foldable USB connector, the metal contacts are electrically connected to an integrated circuit module which comprises a substrate and a memory unit as well as a control unit installed on an internal surface of the substrate.

In the above foldable USB connector, the memory unit and the control unit are encased in an encapsulant body.

In the above foldable USB connector, the first folding part and the second folding part have heights conforming to specifications of a USB connector.

In the above foldable USB connector, the through slot is peripherally located on edges of the first folding part and the second folding part so that the elastic strap is compactly held in the through slot.

In the above foldable USB connector, the through slot is peripherally located on outer edges of the first folding part and the second folding part so that the elastic strap is compactly held in the through slot.

In the above foldable USB connector, the through slot is peripherally located on inner edges of the first folding part and the second folding part so that the elastic strap is compactly held in the through slot.

In the above foldable USB connector, the through slot is peripherally located on partial inner and outer edges of the first folding part and the second folding part so that the elastic strap is compactly held in the through slot.

In the above foldable USB connector, the connective structure comprises a convex part and a concave part.

In the above foldable USB connector, the connective structure can be a south seeking pole and a north seeking pole.

In the above foldable USB connector, the connective structure can be two fasteners engaging each other.

In the above foldable USB connector, the connective structure can be a hinge and a spindle.

In contrast to the prior art, the present invention which effectively employs or saves space is in conformity with current demands for design of a compact device and integrated with other relevant devices to create a composite product with multiple functions and advantages such as compact structure.

DETAILED DESCRIPTIONS OF THE PREFERRED EMBODIMENTS

The preferred embodiments of the present invention are particularly disclosed hereinafter to make purposes, features and effects further understood.

FIG. 2 through FIG. 9 illustrate preferred embodiments for the present invention of a foldable USB connector.

Referring to FIG. 2 through FIG. 5a which illustrate the present invention of a foldable USB connector (1) comprising a first folding part (10), a second folding part (20) and an elastic strap (30). The first folding part (10) coordinates the second folding part (20) to form a connective structure (40) for development of an axis (AO) in between by which the first folding part (10) and the second folding part (20) are turned to become unfolded or folded.

As shown in FIGS. 3 and 7, the first folding part (10) and the second folding part (20) are preferably designed to have a holding groove (11) and a holding grooves (21), respectively: the holding grooves (11, 21) are oppositely arranged for development of a through slot (50). Furthermore, the through slot (50) is peripherally located on edges of the first folding part (10) and the second folding part (20) and allows the elastic strap (30) to be compactly held. Specifically, the through slot (50) can be peripherally arranged on outer edges (not shown in figures) or inner edges (not shown in figures) of both the first folding part (10) and the second folding part (20) or peripherally arranged on partial outer edges as well as partial inner edges (FIG. 7).

As shown in FIGS. 2, 4 and 7, the first folding part (10) and the second folding part (20) on which the elastic strap (30) applies a restoring force are quickly unfolded (or folded) in accordance with the axis (AO) when a user exerts his/her strength on external end planes of the first folding part (10) and the second folding part (20) which have been folded (or unfolded). That is, both the first folding part (10) and the second folding part (20) are conveniently and effortlessly unfolded or folded by means of physical response of the elastic strap (30) and a user's a little strength.

As shown in FIGS. 2, 5a and 8, the first folding part (10) (the second folding part (20)) is provided with a plurality of metal contacts (102) (metal contacts (202)) on a first external surface (101) (a second external surface (201)) wherein the metal contacts (102, 202) are extensively distributed on an end plane (103) and an opposite end plane (203) in order to reach an electric connection with both the first folding part (10) and the second folding part (20) unfolded.

As shown in FIGS. 8 and 9, the metal contacts (102, 202) are further electrically connected to an integrated circuit module (60) comprising a substrate (63) and a memory unit (61) as well as a control unit (62), both of which are installed on an internal surface (631) of the substrate (63). Generally, the substrate (63) is a circuit board with circuits designed, e.g., a single-layered or a multi-layered printed circuit board, a lead frame, a polyimide, a BT board, or an integrated circuit carrier. The substrate (63) with circuits designed inside (not shown in figures) can be taken as an electric interface; the memory unit (61) and the control unit (62) can be electrically connected to the substrate (63) by wire bonding or flip chip technology.

As shown in FIGS. 2, 8 and 9, the integrated circuit module (60) is preferably a non-volatile memory module which depends on the memory unit (61) to save data; the control unit (62) is used to process signals from a USB controller or the memory unit or provide real-time signals. A USB connector (1) is constructed when the integrated circuit module (60) is electrically connected to the metal contacts (102, 202) and both the first folding part (10) and the second folding part (20) are unfolded.

As shown in FIGS. 8 and 9, the integrated circuit module (60) can be also encapsulated as a Chip-On-Board (COB) in which both the memory unit (61) and the control unit (62) are encased by an encapsulant body (64) and passive elements (not shown in figures) necessary for the integrated circuit module (60) are installed on the internal surface (631) of the substrate (63) and encased by the encapsulant body (64). Moreover, Surface Mount Technology (SMT) is referred to as an alternative encapsulation model available to the integrated circuit module (60) based on realistic demands. However, the present invention is not limited to a specific encapsulation technology which has been taken as common sense by the person skilled in the art but is developed with different encapsulation technologies according to a user's demands.

Preferably, the USB connector (1) developed by the first folding part (10) and the second folding part (20) which are totally unfolded (FIG. 2) conforms to specifications of USB 2.0 connectors, "A" Type series, which require both a height ($H_1$) of the first folding part (10) and a height ($H_2$) of the second folding part (20) are less than 2 mm. However, the present invention conforms to not only specifications of USB 2.0 connectors, "A" Type series, but also specifications of other USB interfaces based on a user's realistic demands, such as USB 1.1, USB 3.0, Mini USB and Micro USB, all of which are taken as equivalent changes and incorporated in the patent specification, claims and drawings.

As shown in FIGS. 2, 5a and 8, the connective structure (40) becomes effective with the first folding part (10) and the second folding part (20) linking each other. In this embodiment, both the first folding part (10) and the second folding part (20) unfolded and levelly arranged facilitate electric connection to an electronic device on which there is a USB 2.0 port, A Type series, and the first folding part (10) and the second folding part (20) integrated as a whole in the present invention is conveniently manipulated by a user.

Preferably, the connective structure (40) can be one option among a pair of components as follows: a convex part (41) and a concave part (42) (FIGS. 5a and 8); a south seeking pole (43) and a north seeking pole (44) (FIG. 5b); fasteners (45, 46) engaging each other (FIG. 5c); a hinge (47) and a spindle (48) (FIGS. 5d and 5e). Nevertheless, the connective structure (40) is not limited to those components disclosed hereinbefore.

The present disclosure provides the preferred embodiments which should not restrict the prevent invention as features in drawings only; any change or modification of the person skilled in the art by referring to the above embodiments without departing from the spirit, the patent specification and drawings still within the scope of the present invention.

The present invention which effectively employs or saves space is in conformity with current demands for design of a compact device and integrated with other relevant devices to create a composite product with multiple functions and advantages such as compact structure.

Accordingly, the present invention with effects different from a conventional USB connector and referred to as creative work among similar products meets patentability and is applied for the patent.

It must be reiterated that the above descriptions are preferred embodiments of the present invention only, and any equivalent change in specifications, claims, or drawings of the present invention still belongs to the technical field within the present invention with reference to claims hereinafter.

BRIEF DESCRIPTIONS OF THE DRAWINGS

Figure 1:
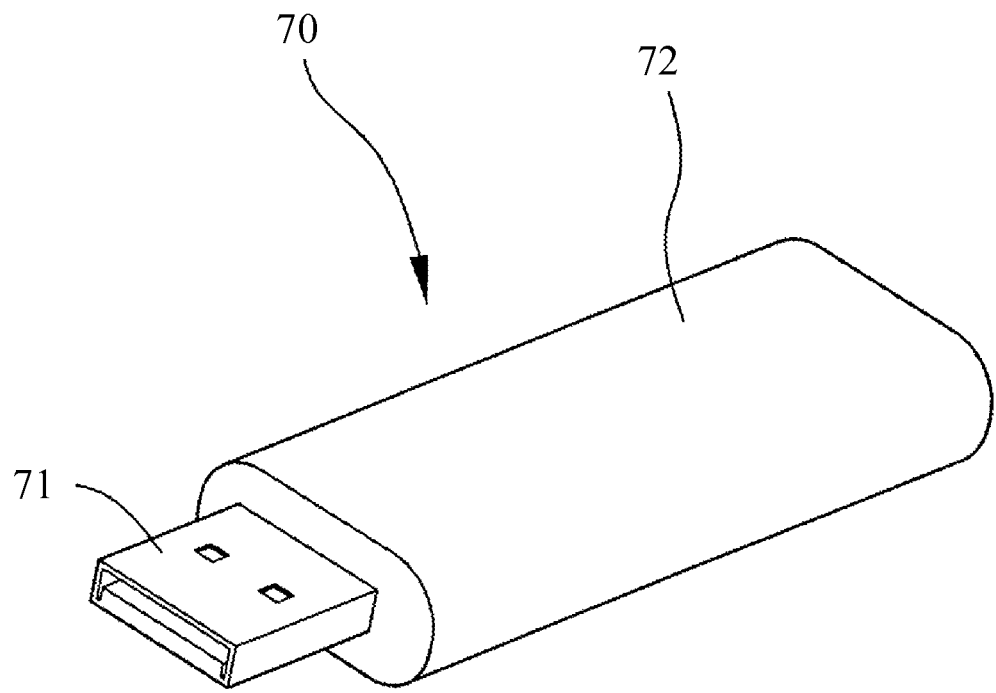
FIG. 1 is a schematic perspective view of a flash disc based on the prior art.
Figure 2:
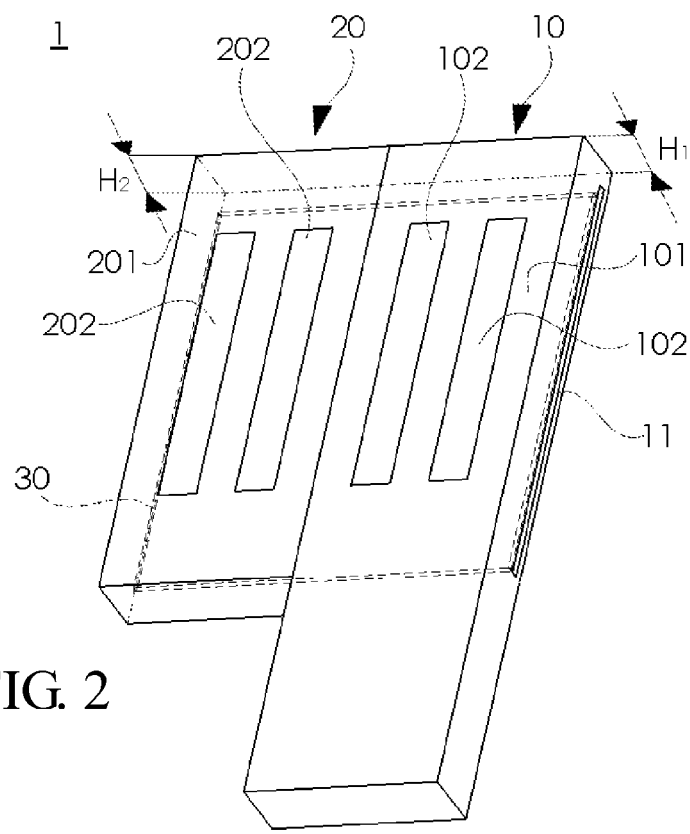
FIG. 2 is a first schematic perspective view illustrating the present invention in a preferred embodiment.
Figure 3:
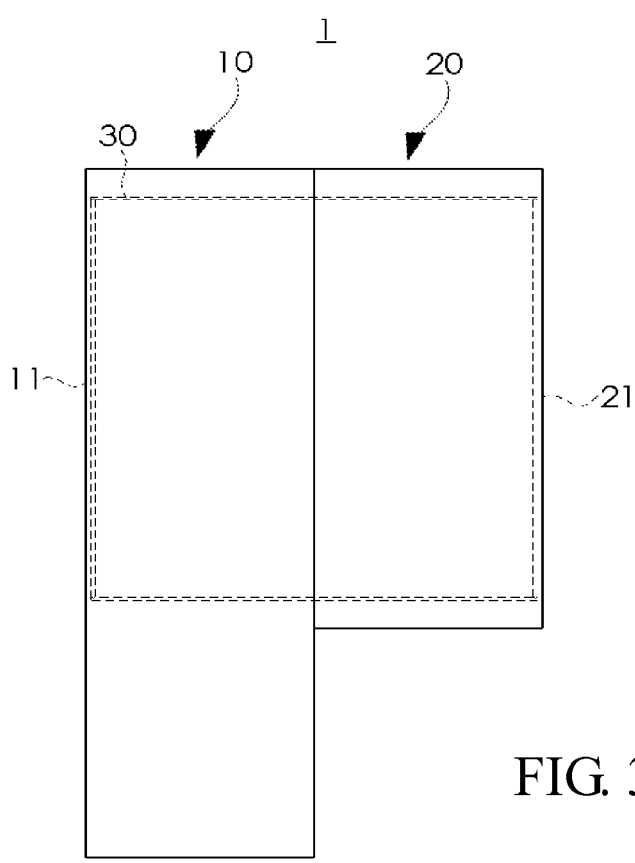
FIG. 3 is a first rear view illustrating the present invention in a preferred embodiment.
Figure 4:
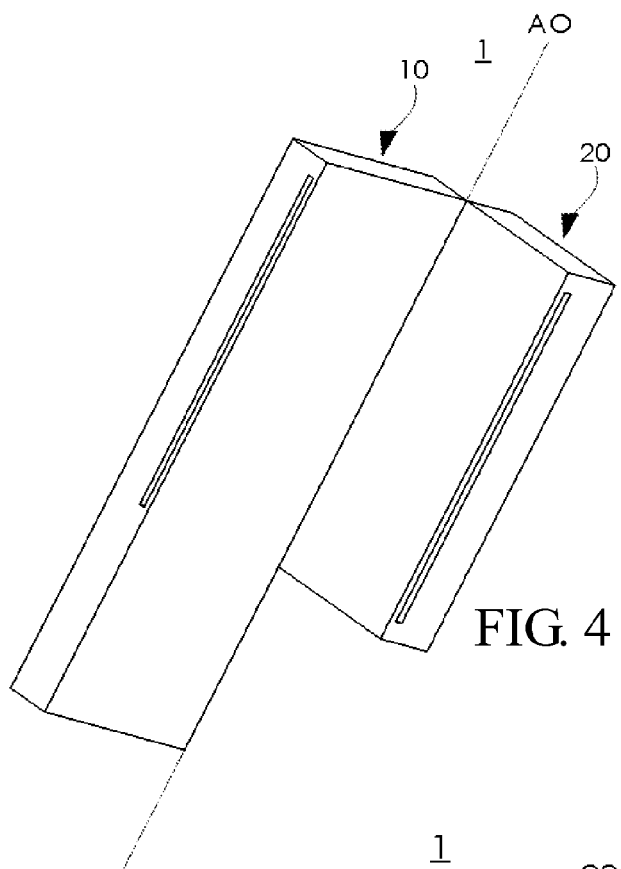
FIG. 4 is a second schematic perspective view illustrating the present invention in a preferred embodiment.
Figure 5A:
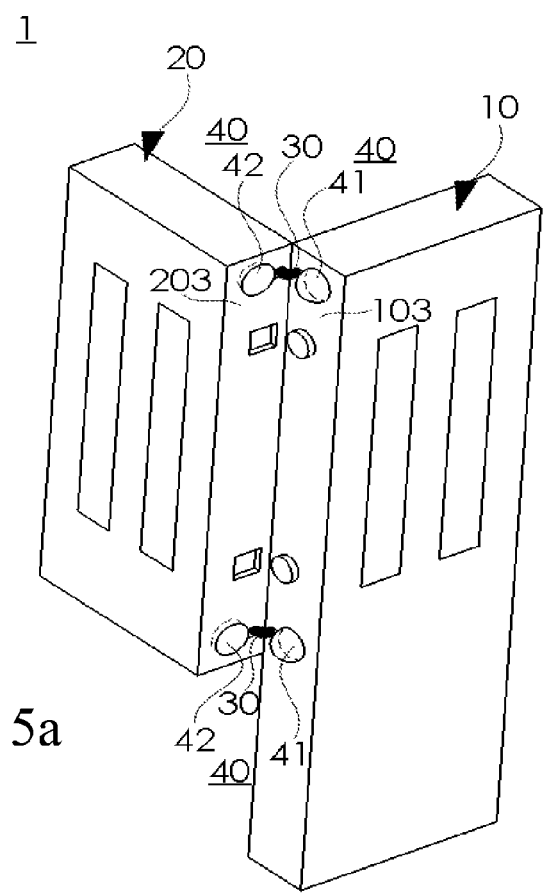
FIG. 5a is a third schematic perspective view illustrating the present invention in a preferred embodiment.
Figure 5B:
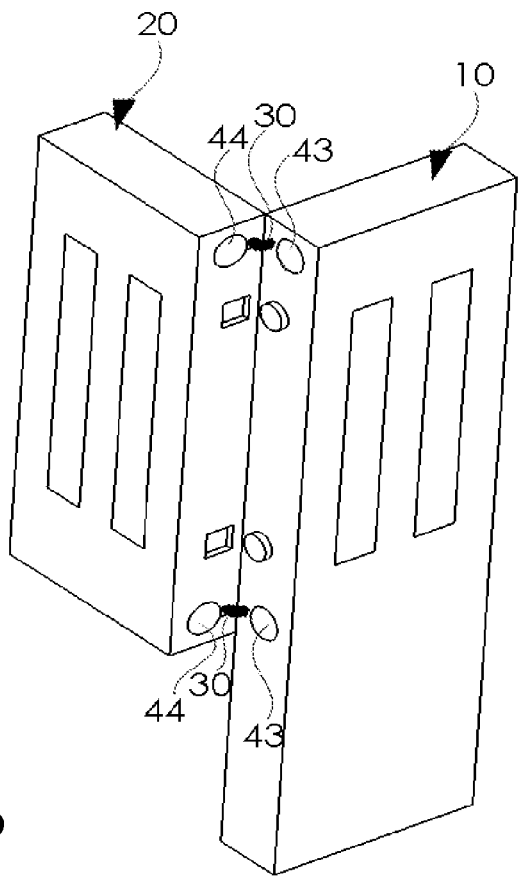
FIG. 5b is a fourth schematic perspective view illustrating the present invention in a preferred embodiment.
Figure 5C:
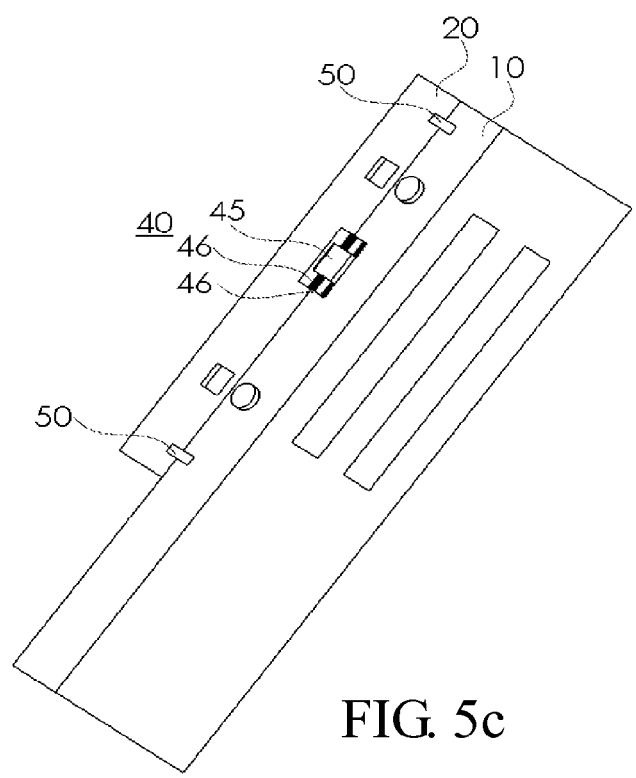
FIG. 5c is a fifth schematic perspective view illustrating the present invention in a preferred embodiment.
Figure 5D:
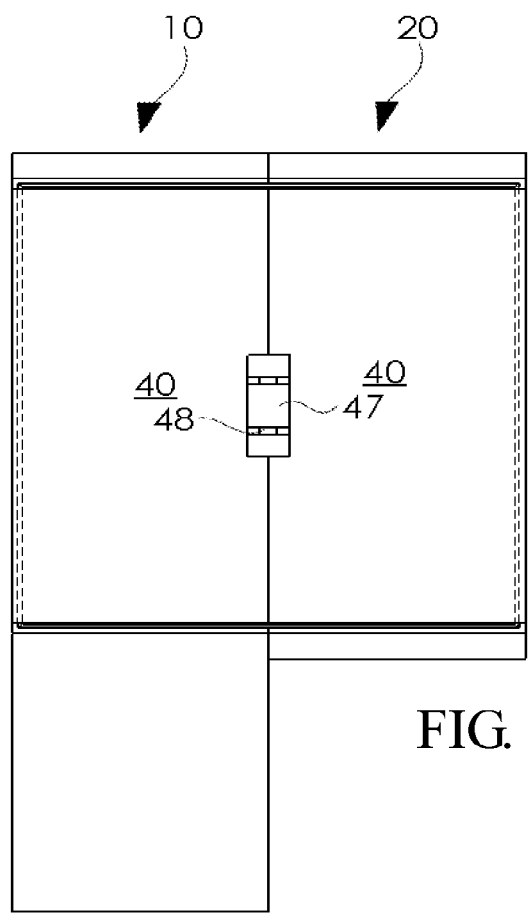
FIG. 5d is a second rear view illustrating the present invention in a preferred embodiment.
Figure 5E:
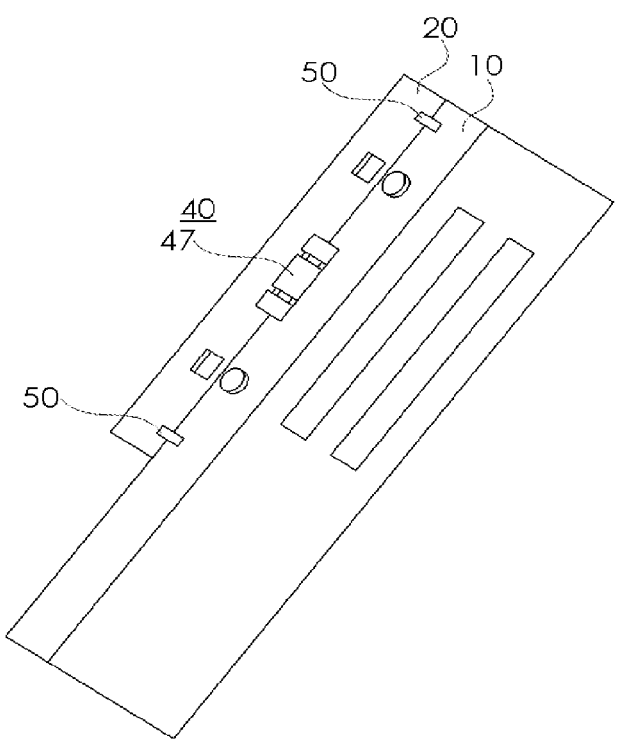
FIG. 5e is a sixth schematic perspective view illustrating the present invention in a preferred embodiment.
Figure 6:
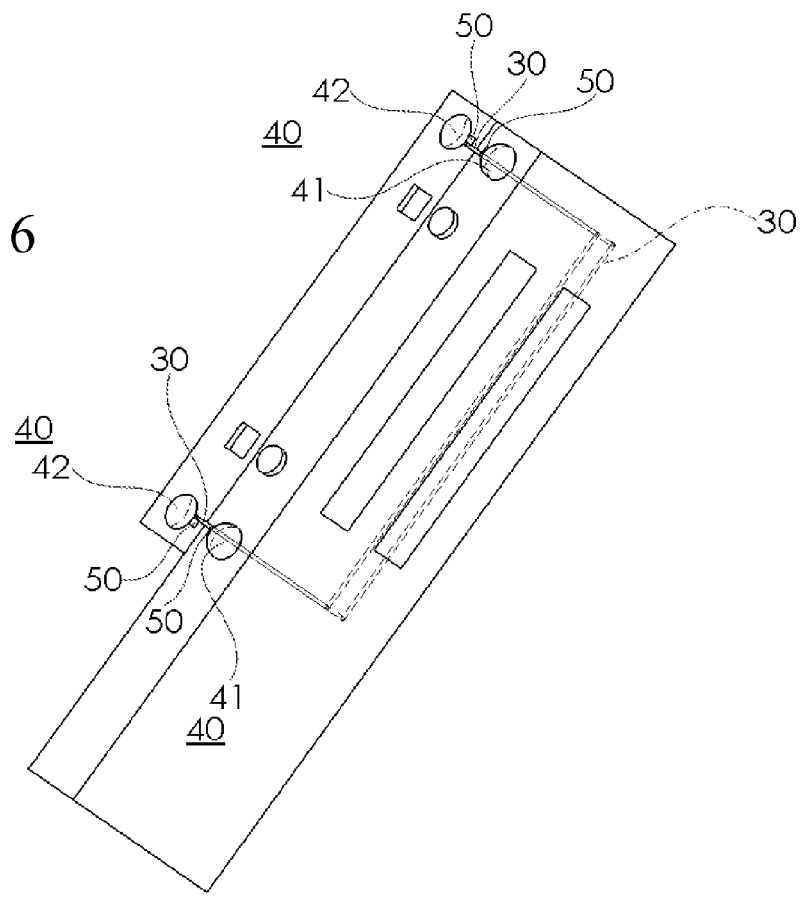
FIG. 6 is a seventh schematic perspective view illustrating the present invention in a preferred embodiment.
Figure 7:
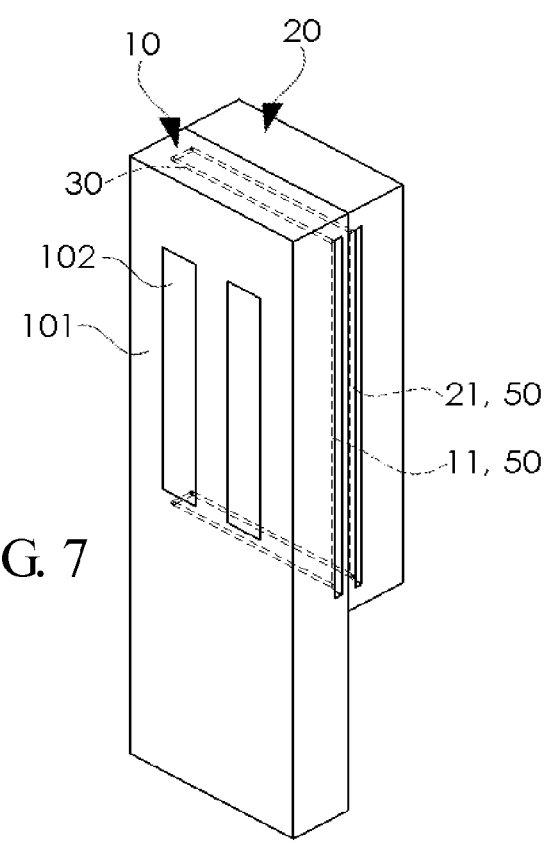
FIG. 7 is an isometric view illustrating the present invention in a preferred embodiment.
Figure 8:
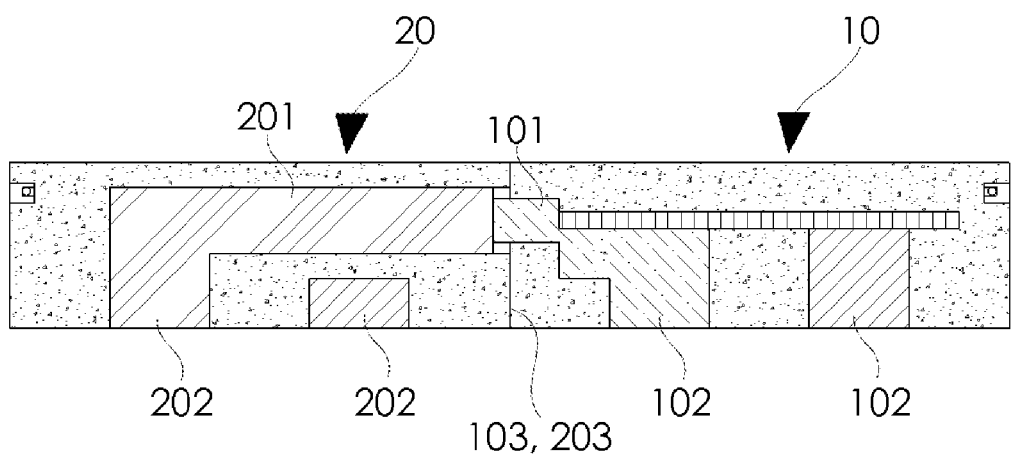
FIG. 8 is a first sectional view illustrating the present invention in a preferred embodiment.
Figure 9:
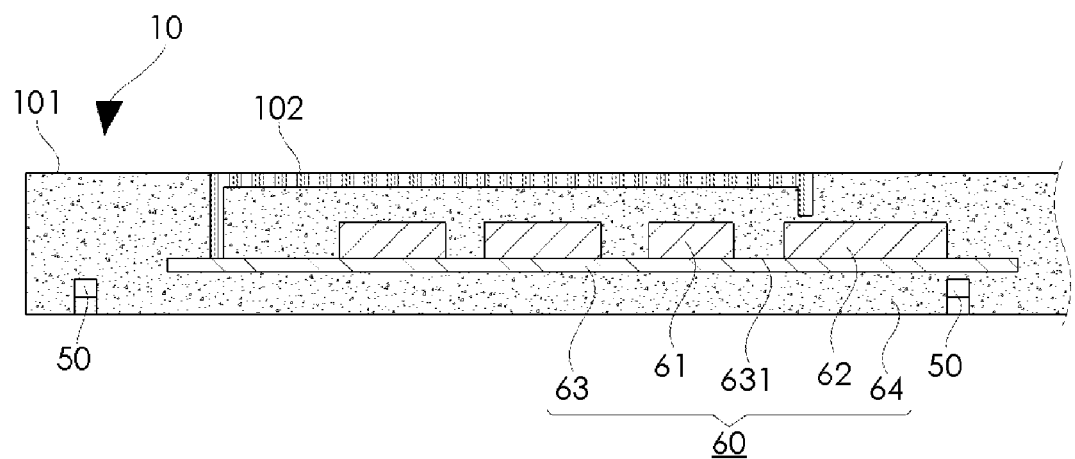
FIG. 9 is a second sectional view illustrating the present invention in a preferred embodiment.

What is claimed is:

1. A foldable USB connector, comprising a first folding part (10), a second folding part (20) and an elastic strap (30):

Said first folding part (10) coordinates said second folding part (20) to form a connective structure (40) in between for development of an axis (AO) by which both said first folding part and said second folding part are turned to become unfolded or folded;

Said first folding part (10) and said second folding part (20) are designed to have holding grooves (11, 21) opposite to each other for development of a through slot (50) in which said elastic strap (30) is compactly held; both said first folding part (10) and said second folding part (20) on which said elastic strap (30) applies a restoring force are quickly unfolded in accordance with said axis (AO) when a user exerts his/her strength on external end planes of said first folding part (10) and said second folding part (20) which have been folded;

Said first folding part (10) is provided with a plurality of metal contacts (102) on a first external surface (101); said second folding part (20) is provided with a plurality of metal contacts (202) on a second external surface (201); said metal contacts (102, 202) are extensively distributed on an end plane (103) of said first folding part (10) and an opposite end plane (203) of said second folding part (20) so that said first folding part (10) and said second folding part (20) which are unfolded and electrically connected become a USB connector (1).

2. The foldable USB connector according to claim 1 wherein said metal contacts (102, 202) are electrically connected to an integrated circuit module (60) comprising a substrate (63) and a memory unit (61) and a control unit (62), both of which are installed on an internal surface (631) of said substrate (63).

3. The foldable USB connector according to claim 2 wherein said memory unit (61) and said control unit (62) are encased in an encapsulant body (64).

4. The foldable USB connector according to claim 1 wherein said first folding part (10) and said second folding part (20) have a height ($H_1$) and a height ($H_2$) in conformity with specifications of a USB connector, respectively.

5. The foldable USB connector according to claim 1 wherein said through slot (50) is peripherally located on edges of said first folding part (10) and said second folding part (20) so that said elastic strap (30) is compactly held in said through slot (50).

6. The foldable USB connector according to claim 5 wherein said through slot (50) is peripherally located on outer edges of said first folding part (10) and said second folding part (20) so that said elastic strap (30) is compactly held in said through slot (50).

7. The foldable USB connector according to claim 1 wherein said through slot (50) is peripherally located on inner edges of said first folding part (10) and said second folding part (20) so that said elastic strap (30) is compactly held in said through slot (50).

8. The foldable USB connector according to claim 1 wherein said through slot (50) is peripherally located on partial inner and outer edges of said first folding part (10) and said second folding part (20) so that said elastic strap (30) is compactly held in said through slot (50).

9. The foldable USB connector according to claim 1 wherein said connective structure (40) comprises a convex part (41) and a concave part (42).

10. The foldable USB connector according to claim 1 wherein said connective structure (40) can be a south seeking pole (43) and a north seeking pole (44).

11. The foldable USB connector according to claim 1 wherein said connective structure (40) can be two fasteners (45, 46) engaging each other.

12. The foldable USB connector according to claim 1 wherein said connective structure (40) can be a hinge (47) and a spindle (48).

* * * * *